(12) United States Patent
Shiikuma

(10) Patent No.: US 9,503,029 B2
(45) Date of Patent: Nov. 22, 2016

(54) TRANSMITTING AMPLIFIER AND TRANSMITTER

(71) Applicant: NEC Corporation, Tokyo (JP)

(72) Inventor: Kazumi Shiikuma, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 14/427,262

(22) PCT Filed: Apr. 9, 2013

(86) PCT No.: PCT/JP2013/060697
§ 371 (c)(1),
(2) Date: Mar. 10, 2015

(87) PCT Pub. No.: WO2014/041835
PCT Pub. Date: Mar. 20, 2014

(65) Prior Publication Data
US 2015/0229276 A1   Aug. 13, 2015

(30) Foreign Application Priority Data

Sep. 14, 2012 (JP) ................. 2012-202590

(51) Int. Cl.
*H03F 3/68* (2006.01)
*H03F 1/02* (2006.01)
(Continued)

(52) U.S. Cl.
CPC ............ *H03F 1/0288* (2013.01); *H03F 1/56* (2013.01); *H03F 1/565* (2013.01); *H03F 3/195* (2013.01);
(Continued)

(58) Field of Classification Search
CPC .......... H03F 1/07; H03F 1/0288; H03F 3/68; H03F 1/3252; H03F 1/06; H03F 3/24; H03F 3/60; H03F 1/565; H03F 3/195; H03F 1/56; H03F 2200/387; H03F 3/245; H04B 2001/0408; H04B 1/04; H04W 88/08

USPC ................ 330/84, 86, 124 R, 126, 130, 295; 333/104, 123, 124, 160, 206, 222, 225, 333/285; 379/338, 443; 455/127.1, 143
See application file for complete search history.

(56) References Cited

U.S. PATENT DOCUMENTS 3,504,306 A * 3/1970 Kam ...................... H01F 19/04
                                                       333/26
2006/0044060 A1    3/2006 Shiikuma

FOREIGN PATENT DOCUMENTS

JP       H11-68420 A       3/1999
JP       2001-127650 A     5/2001
(Continued)

OTHER PUBLICATIONS

Xiaoqun Chen, Yuchun Guo, and Xiaowei Shi, "A High Linearity and E±ciency Doherty Power Ampli¨er for Retrodirective Communication", Piers Online, vol. 4, No. 2, 2008.*
(Continued)

*Primary Examiner* — Steven J Mottola
*Assistant Examiner* — Hafizur Rahman
(74) *Attorney, Agent, or Firm* — Wilmer Cutler Pickering Hale and Dorr LLP

(57) ABSTRACT

The present invention is applied to a transmitting amplifier including one of a carrier amplifier and a peak amplifier as a first amplifier and the other as a second amplifier. A transmitting amplifier according to the present invention includes a transmission line transformer with a ¼ wavelength, dual-coaxial structure such that a center conductor, an inner conductor, and an outer conductor are formed in that order from the center toward the outside. The center conductor and the inner conductor constitute a first coaxial line, and the inner conductor and the outer conductor constitute a second coaxial line. The output of the first amplifier is connected to one end of the first and the second coaxial lines, and an output terminal is connected to the other end of the first and second coaxial lines. The other end of the first coaxial line, the output of the second amplifier, and the other end of the second coaxial line are connected.

8 Claims, 5 Drawing Sheets

(51) Int. Cl.
  *H03F 3/24* (2006.01)
  *H03F 1/56* (2006.01)
  *H04B 1/04* (2006.01)
  *H03F 3/195* (2006.01)
  *H04W 88/08* (2009.01)
(52) U.S. Cl.
  CPC ............... *H03F 3/245* (2013.01); *H03F 3/68* (2013.01); *H04B 1/04* (2013.01); *H03F 2200/387* (2013.01); *H04B 2001/0408* (2013.01); *H04W 88/08* (2013.01)

(56) References Cited

FOREIGN PATENT DOCUMENTS

| JP | 2006-067176 A | 3/2006 |
| JP | 2006-148780 A | 6/2006 |
| JP | 2006148780 A * | 6/2006 |
| JP | 2010-206351 A | 9/2010 |

OTHER PUBLICATIONS

International Search Report corresponding to PCT/JP2013/060697 mailed Jul. 16, 2013 (2 pages).

McMorrow, R.J.; Upton, D.M.; Malony, P.R. "The Microwave Doherty Amplifier" IEEE Microwave International Symposium Digest, 1994 (pp. 1653-1656).

* cited by examiner

TRANSMITTING AMPLIFIER AND TRANSMITTER

CROSS-REFERENCE TO RELATED APPLICATIONS

This application is a national stage application of International Application No. PCT/JP2013/060697 entitled "Transmitting Amplifier and Transmitter," filed on Apr. 9, 2013, which claims the benefit of the priority of Japanese Patent Application No. 2012-202590, filed on Sep. 14, 2012, the disclosures of each of which are hereby incorporated by reference in their entirety.

TECHNICAL FIELD

The present invention relates to a transmitting amplifier and a transmitter.

BACKGROUND ART

A base station of a wireless communication system transmits a signal having an average power which is largely different from a peak power. In recent years, it is considered to employ a Doherty amplifier in order to enhance efficiency of a transmitting amplifier which is used in a transmitter of the base station, etc.

In the Doherty amplifier, a signal distributor distributes an input signal into two amplifiers. A carrier amplifier always amplifies one signal, and a peak amplifier amplifies only signal with a predetermined higher power level in the other signal.

Besides, in the Doherty amplifier, an output of the carrier amplifier is combined with an output of the peak amplifier through a Doherty combiner, and an impedance transformer is placed between the power combining point and a load (e.g. refer to Patent Literature 1 and Non Patent Literature 1). The impedance transformer is placed in order to mutually transform characteristic impedance between Z0 and (½)× Z0.

The Doherty combiner and the impedance transformer are basically composed of a quarter wavelength transmission line.

Besides, each of the characteristic impedance Z0 of the Doherty combiner and the impedance transformer is determined on the basis of desired impedance transformation ratio depending on a configuration of the Doherty amplifier. In the technology described in Patent Literature 1, for example, the characteristic impedance Z0 of the Doherty combiner is set at 50Ω and the characteristic impedance Z0 of the impedance transformer is set at 35.4Ω (=(50×25)^(½)).

CITATION LIST

Patent Literature

PTL 1: Japanese Patent Application Laid-Open No. 2010-206351

Non Patent Literature

NPL 1: McMorrow, R. J.; Upton, D. M.; Maloney, P. R. "The Microwave Doherty Amplifier" IEEE Microwave International Symposium Digest, 1994, pp 1653-1656.

SUMMARY OF INVENTION

Technical Problem

As described above, in the related Doherty amplifier, each of the Doherty combiner and the impedance transformer is basically composed of a quarter wavelength transmission line and a certain amount of mounting area (volume) is occupied. Therefore, it is disadvantageous for reduction in size and consequently to miniaturize the size of the transmitter is difficult. The problem becomes pronounced if a frequency is lowered.

An object of the invention is to provide a technology enabling miniaturization of a transmitter having a transmitting amplifier.

Solution to Problem

A first transmitting amplifier of the invention including one of a carrier amplifier and a peak amplifier as a first amplifier and the other as a second amplifier, includes a quarter wavelength transmission line transformer, having a dual-coaxial structure such that a center conductor, an inner conductor, and an outer conductor are formed in that order from the center toward the outside, wherein the center conductor and the inner conductor constitute a first coaxial line, the inner conductor and the outer conductor constitute a second coaxial line, the output of the first amplifier is connected to one end of the first and second coaxial lines, an output terminal is connected to the other end of the first and second coaxial lines, and the other end of the first coaxial line, the output of the second amplifier, and the other end of the second coaxial line are connected.

A second transmitting amplifier including one of a carrier amplifier and a peak amplifier as a first amplifier and the other as a second amplifier, includes a first quarter wavelength transmission line transformer that is connected to the output of the first amplifier and the output of the second amplifier, and a second quarter wavelength transmission line transformer that is connected to the output of the second amplifier and an output terminal, wherein the second transmission line transformer comprises a pair of conductors, at one end of the second quarter wavelength transmission line transformer, one conductor of the pair of conductors is connected to the output of the second amplifier and the other conductor of the pair of conductors is grounded, at the other end of the second quarter wavelength transmission line transformer, the one conductor of the pair of conductors is grounded and the other conductor of the pair of conductors is connected to the output terminal.

The transmitter of the invention is characterized in having the transmitting amplifier.

Advantageous Effects of Invention

According to the invention, an effect of enabling miniaturization of the transmitter using the transmitting amplifier is acquired.

DESCRIPTION OF EMBODIMENTS

Descriptions of exemplary embodiments of the invention are explained below by referring to drawings.

(1) First Exemplary Embodiment

Figure 1:
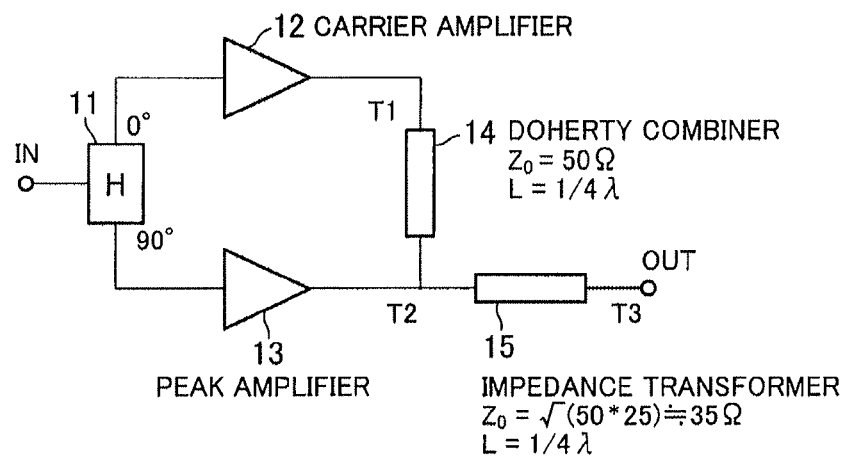
FIG. 1 is a circuit diagram illustrating an equivalent circuit of a Doherty amplifier of a first exemplary embodiment and a second exemplary embodiment of the invention.

FIG. 1 shows an equivalent circuit of a Doherty amplifier of the exemplary embodiment.

As shown in FIG. 1, the Doherty amplifier of the invention includes a signal distributor (Hybrid) 11, a carrier amplifier 12, a peak amplifier 13, a Doherty combiner 14 and an impedance transformer 15. In the Doherty amplifier, the carrier amplifier 12 corresponds to a first amplifier, and the peak amplifier 13 corresponds to a second amplifier.

The signal distributor 11 distributes and outputs a signal inputted through an input terminal IN to the carrier amplifier 12 and the peak amplifier 13.

If the signal outputted to the carrier amplifier 12 side has a phase of 0-degree, the signal distributor 11 outputs a signal having a phase delayed by 90-degree to the peak amplifier 13 side.

Thereby it is possible to compensate phase delay of 90-degree (quarter wavelength) which is generated while the output signal of the carrier amplifier 12 propagates in the Doherty amplifier 14, and consequently the output signal of the carrier amplifier 12 and the output signal of the peak amplifier 13 can be combined at the combining point in phase with each other.

The carrier amplifier 12 is a class-AB amplifier which always amplifies one signal distributed by the signal distributor 11.

The peak amplifier 13 is a class-C amplifier which amplifies only signal greater than or equal to a predetermined level in the other signal distributed by the signal distributor 11.

The Doherty combiner 14, which is connected to the output of the carrier amplifier 12 and the output of the peak amplifier 13, is set in order to combine the output signal of the carrier amplifier 12 with the output signal of the peak amplifier 13.

The impedance transformer 15, which is connected to the output of the peak amplifier 13 and the output terminal OUT, is set in order to mutually transform characteristic impedance between Z0 and (½)×Z0.

Each characteristic impedance Z0 of the Doherty combiner 14 and the impedance transformer 15 is determined on the basis of a desired impedance transformation ratio depending on a configuration of the Doherty amplifier, and, in the exemplary embodiment, characteristic impedance Z0 of the Doherty combiner 14 is set at 50Ω, and characteristic impedance Z0 of the impedance transformer is set at 35Ω ((50×25)^(½)).

As described above, the Doherty combiner 14 and the impedance transformer 15 are basically composed of a quarter wavelength transmission line. In the configuration, since a certain amount of a mounting area (volume) is occupied, it is disadvantageous for miniaturization.

Figure 2:
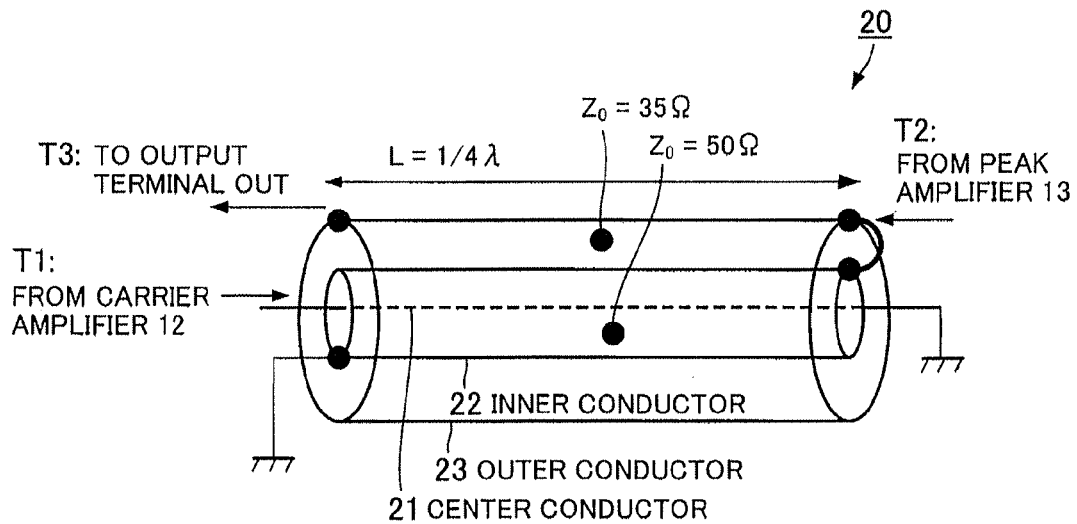
FIG. 2 is a diagram illustrating a transmission line transformer having a dual-coaxial structure with quarter wavelength which is used for the Doherty amplifier of the first exemplary embodiment of the invention.

Accordingly, in the exemplary embodiment, as shown in FIG. 2, the Doherty combiner 14 and the impedance transformer 15 are composed of a transmission line transformer 20 having a quarter wavelength dual-coaxial structure and the Doherty amplifier is miniaturized. T1 to T3 in FIG. 2 correspond to positions of T1 to T3 in FIG. 1, respectively.

Specifically, the transmission line transformer 20 has the length L of quarter wavelength in the axial direction and has the dual-coaxial structure in which a center conductor 21, an inner conductor 22 and an outer conductor 23 are formed in that order from the center toward the outside. Dielectric materials fill a gap between the center conductor 21 and the inner conductor 22, and a gap between the inner conductor 22 and the outer conductor 23.

Besides, a first coaxial line is composed of the center conductor 21 and the inner conductor 22, and a second coaxial line is composed of the inner conductor 22 and the outer conductor 23.

And, the output of the carrier amplifier 12 is connected to one end of the first coaxial line (left end in FIG. 2), the output terminal OUT is connected to one end of the second coaxial line (left end in FIG. 2), and the other end of the first coaxial line (right end in FIG. 2), the output of the peak amplifier 13, and the other end of the second coaxial line (right end in FIG. 2) are connected.

For more detail, in one end of the first and the second coaxial lines (left end in FIG. 2), the center conductor 21 is connected to the output of the carrier amplifier 12, the inner conductor 22 is grounded, and the outer conductor 23 is connected to the output terminal OUT. In the other end of the first and the second coaxial lines (right end in FIG. 2), the center conductor 21 is grounded, the inner conductor 22 is connected to the outer conductor 23, and the outer conductor 23 is connected to the output of the peak amplifier 13.

Besides, characteristic impedance Z0 of the first coaxial line is set at 50Ω, and characteristic impedance Z0 of the second coaxial line is set at 35Ω.

As mentioned above, the Doherty combiner 14 can be realized by the first coaxial line, and the impedance transformer 15 can be realized by the second coaxial line.

Whereas, in a related Doherty amplifier, each of the Doherty combiner 14 and the impedance transformer 15 requires a mounting area (volume), in the Doherty amplifier of the present invention, the Doherty combiner 14 and the impedance transformer 15 can share a part of a conductor (inner conductor 22).

Therefore, reduction in size and weight of the Doherty amplifier is achieved, a transmitter with the Doherty amplifier can be miniaturized.

In the transmission line transformer, characteristic impedance Z0 of the first and the second coaxial lines can be set at the above described values by optionally adjusting permittivity of dielectric materials filled thereinside and/or a radius of the coaxial lines.

In the Doherty amplifier of the exemplary embodiment, phase delay of 90-degree (quarter wavelength) is generated in the output signal of the carrier amplifier 12 since the signal propagates in the Doherty combiner 14, and further a sign of the signal is inverted to generate phase delay of 180-degree (phase inversion type).

Therefore, the signal distributor 11 further delays a phase of a signal to be outputted to the peak amplifier 13 side by 180-degree. Thereby the output signal of the carrier amplifier 12 and the output signal of the peak amplifier 13 can be combined at the combining point in phase with each other.

Incidentally, a transmitter of a base station, etc. includes a quarter wavelength short stub, or a coil as a surge absorber in a signal path between a transmitting amplifier and an antenna terminal in order to bypass a surge current which flows from the antenna terminal during the lightning strike.

Figure 3:
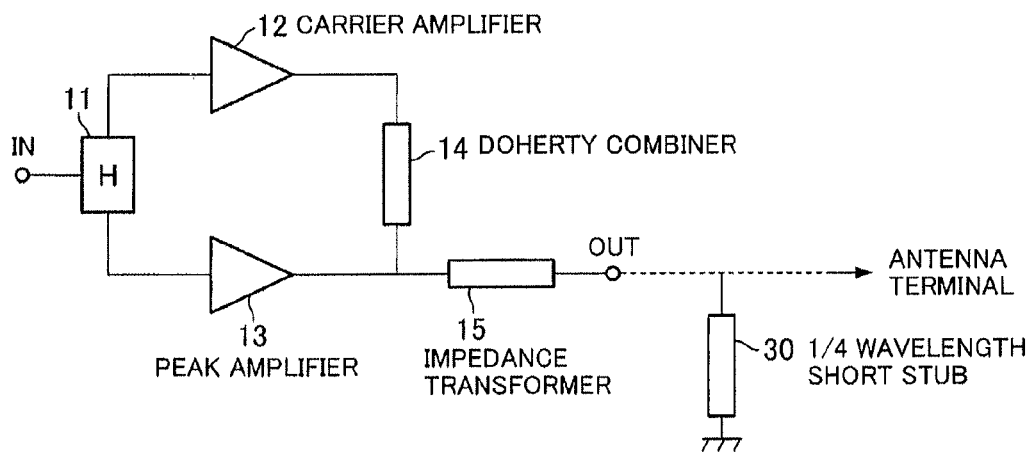
FIG. 3 is a diagram illustrating an example of a base station with a surge absorber.

For example, in the base station shown in FIG. 3, the Doherty amplifier is used as a transmitting amplifier, and a short stub 30 with quarter wavelength as a surge absorber is located in a signal path between the output terminal OUT of the Doherty amplifier and an antenna terminal.

When the Doherty amplifier of the exemplary embodiment is applied, when viewed from the output terminal OUT, the output of the carrier amplifier 12 is grounded at the other end of the transmission line transformer 20 (right end in FIG. 2) through the center conductor 21, and the output of the peak amplifier 13 is grounded at one end of the transmission line transformer 20 (left end in FIG. 2) through the inner conductor 22.

As described above, the Doherty amplifier of the exemplary embodiment includes a function of a surge absorber which bypasses a surge current flowing from the antenna terminal.

Accordingly, if the Doherty amplifier of the exemplary embodiment is applied to a base station, a configuration without a surge absorber can be formed. Therefore, this configuration can contribute to reduction in size and cost.

Besides, if the Doherty amplifier of the exemplary embodiment is applied to a base station including the surge absorber, resistance to the surge current from the antenna terminal can be further improved. Consequently, since reliability of a base station is improved and resistance required for the surge absorber can be reduced, reduction in cost of a base station is achieved and the inner circuit is simplified.

(2) Second Exemplary Embodiment

A Doherty amplifier of the exemplary embodiment differs in a connection structure of the other end of the transmission line transformer 20 (right end in FIG. 2) from the first exemplary embodiment and the others thereof are similar to the first exemplary embodiment.

Figure 4:
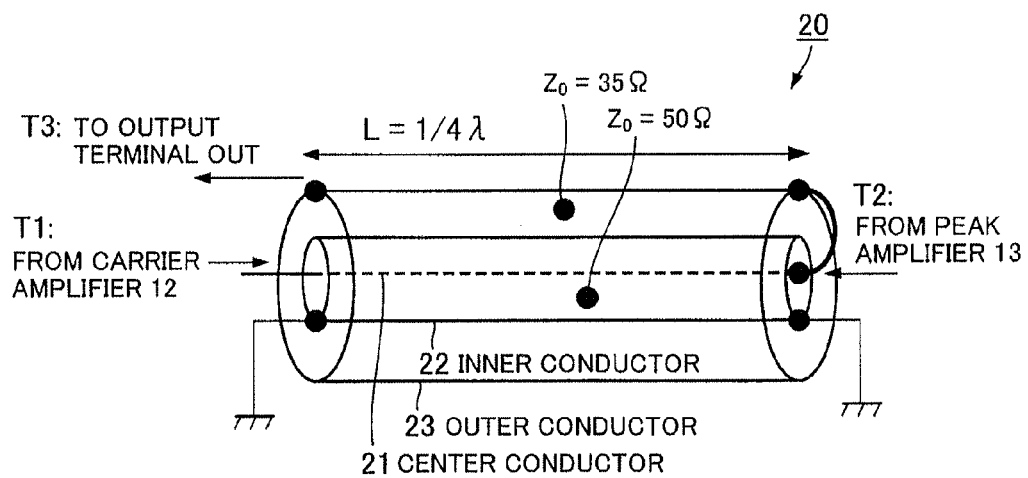
FIG. 4 is a diagram illustrating a transmission line transformer having a dual-coaxial structure with quarter wavelength which is used for a Doherty amplifier of the second exemplary embodiment of the invention.

FIG. 4 shows a configuration of a transmission line transformer 20 used for the Doherty amplifier of the exemplary embodiment. T1 to T3 in FIG. 4 correspond to positions of T1 to T3 in FIG. 1, respectively.

As shown in FIG. 4, in the Doherty amplifier of the exemplary embodiment, in one end of the first and the second coaxial lines (left end in FIG. 4), like as the first exemplary embodiment, the center conductor 21 is connected to the output of the carrier amplifier 12, the inner conductor 22 is grounded, and the outer conductor 23 is connected to the output terminal OUT. In the other end of the first and the second coaxial lines (right end in FIG. 4), the inner conductor 22 is grounded, the center conductor 21 is connected to the outer conductor 23, and the center conductor 21 is connected to the output of the peak amplifier 13.

In the Doherty amplifier of the exemplary embodiment, only phase delay of 90-degree (quarter wavelength) is generated in the output signal of the carrier amplifier 12 while the signal propagates in the Doherty combiner 14 (non-phase inversion type).

Accordingly, as described above, the signal distributor 11 only has to delay the phase of the signal to be outputted to the peak amplifier 13 side by 90-degree.

(3) Third Exemplary Embodiment

Figure 5:
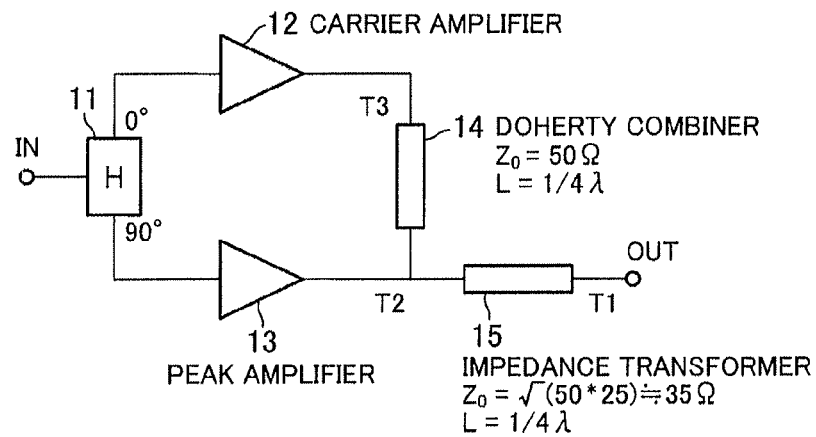
FIG. 5 is a circuit diagram illustrating an equivalent circuit of a Doherty amplifier of a third exemplary embodiment and a fourth exemplary embodiment of the invention.

FIG. 5 shows an equivalent circuit of a Doherty amplifier of the exemplary embodiment.

As shown in FIG. 5, a circuit configuration of the Doherty amplifier of the exemplary embodiment is the same as those of the first and the second exemplary embodiments.

In the Doherty amplifiers of the first and the second exemplary embodiments, the first coaxial line composed of the center conductor 21 and the inner conductor 22 forms the Doherty combiner 14, and the second coaxial line composed of the inner conductor 22 and the outer conductor 23 forms the impedance transformer 15.

On the other hand, in the Doherty amplifier of the exemplary embodiment, the first coaxial line forms the impedance transformer 15, and the second coaxial line forms the Doherty combiner 14.

Figure 6:
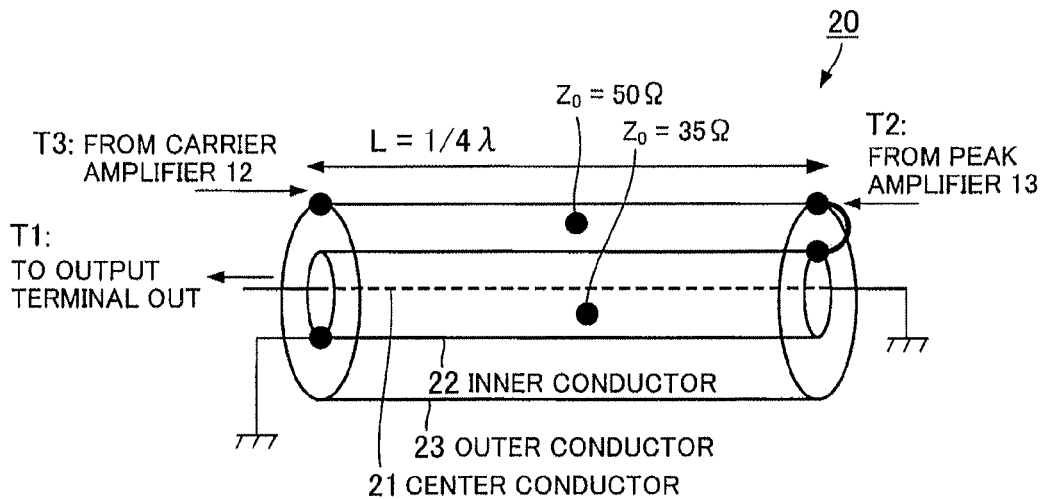
FIG. 6 is a diagram illustrating a transmission line transformer having a dual-coaxial structure with quarter wavelength which is used for the Doherty amplifier of the third exemplary embodiment of the invention.

FIG. 6 shows a configuration of a transmission line transformer 20 used for the Doherty amplifier of the exemplary embodiment. T1 to T3 in FIG. 6 correspond to positions of T1 to T3 in FIG. 5, respectively.

As shown in FIG. 6, in the Doherty amplifier of the exemplary embodiment, the output terminal OUT is connected to one end of the first coaxial line composed of the center conductor 21 and the inner conductor 22 (left end in FIG. 6), the output of the carrier amplifier 12 is connected to one end of the second coaxial line composed of the inner conductor 22 and the outer conductor 23 (left end in FIG. 6), and the other end of the first coaxial line (right end in FIG. 6), the output of the peak amplifier 13, and the other end of the second coaxial line (right end in FIG. 6) are connected.

For more detail, in one end of the first and the second coaxial lines (left end in FIG. 6), the center conductor 21 is connected to the output terminal OUT, the inner conductor 22 is grounded, and the outer conductor 23 is connected to the output of the carrier amplifier 12. In the other end of the first and the second coaxial lines (right end in FIG. 6), the center conductor 21 is grounded, the inner conductor 22 is connected to the outer conductor 23, and the outer conductor 23 is connected to the output of the peak amplifier 13.

In the Doherty amplifier of the exemplary embodiment, since the first coaxial line forms the impedance transformer 15 and the second coaxial line forms the Doherty combiner 14, characteristic impedance Z0 of the first coaxial line is set at 35Ω and characteristic impedance Z0 of the second coaxial line is set at 50Ω.

In the Doherty amplifier of the exemplary embodiment, like the first and the second exemplary embodiment, since the Doherty combiner 14 and the impedance transformer 15 can share a part of a conductor (inner conductor 22), reduction in size and weight of the Doherty amplifier is achieved, and thereby a transmitter with the Doherty amplifier can be miniaturized.

In the Doherty amplifier of the exemplary embodiment, phase delay of 90-degree (quarter wavelength) is generated in the output signal of the carrier amplifier 12 while the signal propagates in the Doherty combiner 14, and further a sign is inverted and phase delay of 180-degree is generated (phase inversion type), like the first exemplary embodiment.

Therefore, the signal distributor 11 further delays a phase of a signal to be outputted to the peak amplifier 13 side by 180-degree. Thereby the output signal of the carrier amplifier 12 and the output signal of the peak amplifier 13 can be combined at the combining point in phase with each other.

In the Doherty amplifier of the exemplary embodiment, when viewed from the output terminal OUT, the output of the carrier amplifier 12 and the output of the peak amplifier 13 are grounded at one end of the transmission line transformer 20 (left end in FIG. 6) through the inner conductor 22.

For this reason, the Doherty amplifier of the exemplary embodiment includes a function of a surge absorber which bypasses a surge current flowing from the antenna terminal, like the first exemplary embodiment.

Consequently, if the Doherty amplifier of the exemplary embodiment is applied to a base station, a configuration without a surge absorber can be formed. Therefore, this configuration can contribute to reduction in size and cost.

And, if the Doherty amplifier of the exemplary embodiment is applied to a base station including the surge absorber, resistance to the surge current from the antenna terminal can be further improved. Consequently, since reliability of the base station is improved and resistance required for the surge absorber can be reduced, reduction in cost of the base station is achieved and the inner circuit is simplified.

(4) Fourth Exemplary Embodiment

A Doherty amplifier of the exemplary embodiment differs in a connection structure of the other end of the transmission line transformer 20 (right end in FIG. 6) from the third exemplary embodiment and the others thereof are similar to the third exemplary embodiment.

Figure 7:
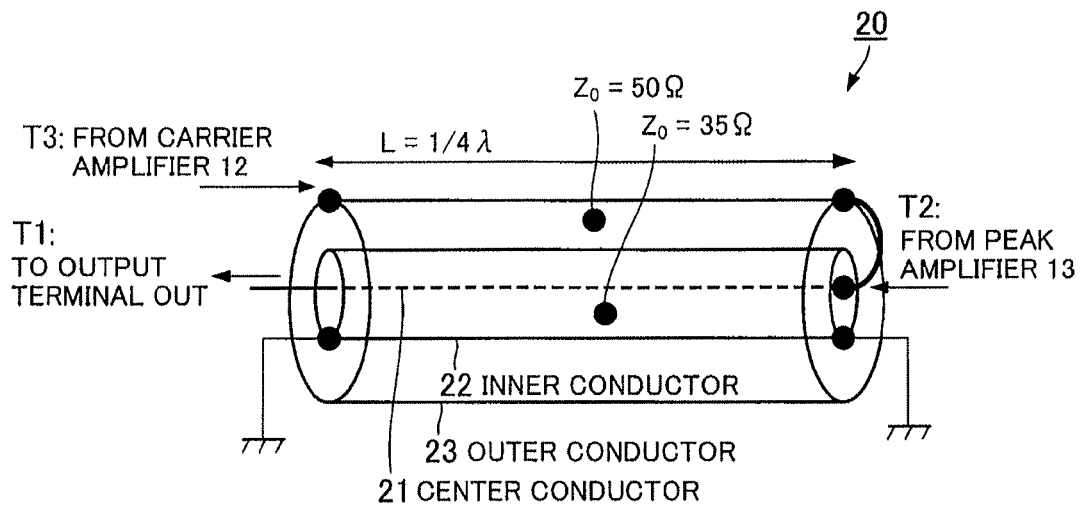
FIG. 7 is a diagram illustrating a transmission line transformer having a dual-coaxial structure with quarter wavelength which is used for the Doherty amplifier of the fourth exemplary embodiment of the invention.
Figure 8:
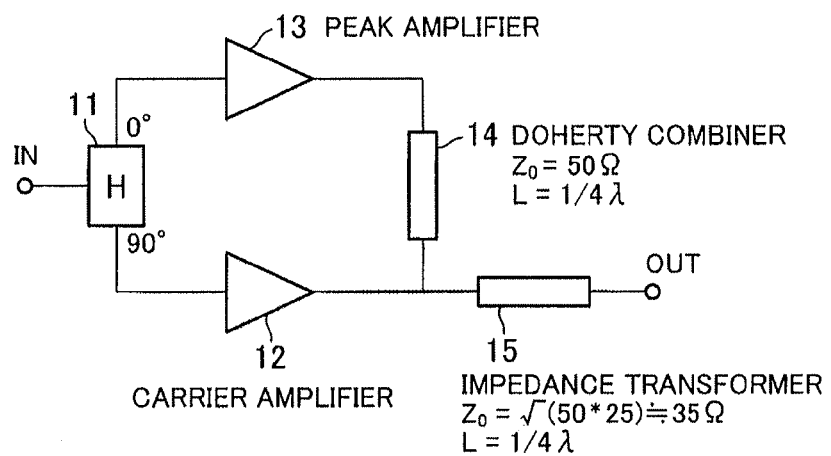
FIG. 8 is a circuit diagram illustrating an equivalent circuit of an inverse Doherty amplifier applied to the invention.

FIG. 7 shows a configuration of the transmission line transformer 20 used for the Doherty amplifier of the exemplary embodiment. T1 to T3 in FIG. 7 correspond to positions of T1 to T3 in FIG. 5, respectively.

As shown in FIG. 7, in the Doherty amplifier of the exemplary embodiment, at one end of the first and the second coaxial lines (left end in FIG. 7), the center conductor 21 is connected to the output terminal OUT, the inner conductor 22 is grounded, and the outer conductor 23 is connected to the output of the carrier amplifier 12, like the third exemplary embodiment. In the other end of the first and the second coaxial lines (right end in FIG. 7), the inner conductor 22 is grounded, the center conductor 21 is connected to the outer conductor 23, and the center conductor 21 is connected to the output of the peak amplifier 13.

In the Doherty amplifier of the exemplary embodiment, only phase delay of 90-degree (quarter wavelength) is generated in the output signal of the carrier amplifier 12 while the signal propagates in the Doherty combiner 14 (non-phase inversion type), like the second exemplary embodiment.

As described above, the signal distributor 11 only has to delay the phase of the signal to be outputted to the peak amplifier 13 side by 90-degree.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

For example, while, in the above exemplary embodiments, an example in which the transmitting amplifier of the invention is applied to the Doherty amplifier is described, the invention may be applied to an amplifier called an inverted Doherty amplifier in which a position of the carrier amplifier 12 is replaced with a position of the peak amplifier 13. In the inverted Doherty amplifier, the peak amplifier 13 corresponds to the first amplifier and the carrier amplifier 12 corresponds to the second amplifier.

When the invention is applied to the invert Doherty amplifier, the four types of configurations which are described in the first exemplary embodiment to the fourth exemplary embodiment are applicable as the configuration of the transmission line transformer 20.

Figure 9:
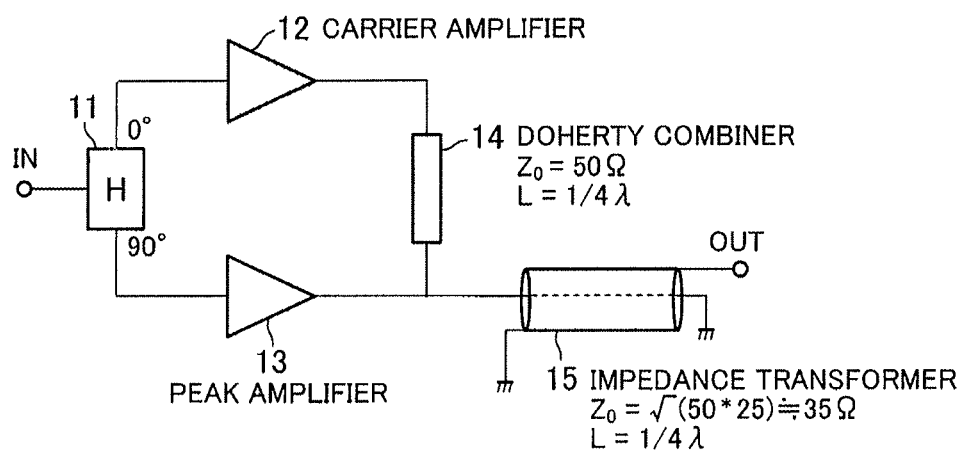
FIG. 9 is a diagram illustrating a Doherty amplifier of another exemplary embodiment of the invention.

Besides, in the above exemplary embodiments, the transmission line transformer 20 having the dual-coaxial structure is used. As shown in FIG. 9, the invention may employ a phase inversion type transmission line transformer with quarter wavelength which does not have the dual-coaxial structure (coaxial structure in which a center conductor and an outer conductor are formed in that order from the center toward the outside). In this configuration, in one end of the transmission line transformer (left end in FIG. 9), the center conductor is connected to the output of the peak amplifier 13 and the outer conductor is grounded. In the other end of the transmission line transformer (right end in FIG. 9), the center conductor is grounded and the outer conductor is connected to the output terminal OUT.

As described above, since the output of the carrier amplifier 12 and the output of the peak amplifier 13 are grounded if the phase inversion type transmission line transformer is used as the impedance transformer 15, the Doherty amplifier of FIG. 9 includes a function of a surge absorber. For this reason, when the Doherty amplifier of FIG. 9 is applied to a transmitter, a configuration without a surge absorber becomes possible and reduction in size and cost of the transmitter is achieved. In this configuration, since a phase is inversed after the output signal of the carrier amplifier 12 and the output signal of the peak amplifier 13 are combined, the signal distributor 11 does not need to further delay the phase of the signal to be outputted to the peak amplifier 13 side by 180-degree.

In addition to the configuration of FIG. 9, the Doherty combiner 14 may be replaced with the phase inversion type transmission line transformer with quarter wavelength (coaxial structure in which a center conductor and an outer conductor are formed in that order from the center toward the outside). In this configuration, resistance of the carrier amplifier 12 to the surge current from the antenna terminal can be further improved. In this configuration, in one end of the transmission line transformer (upper end in FIG. 9), the center conductor is connected to the output of the carrier amplifier 12 and the outer conductor is grounded. In the other end of the transmission line transformer (bottom end in FIG. 9), the center conductor is grounded and the outer conductor is connected to the output of the peak amplifier 13. In this configuration, since a phase is inversed before the output signal of the carrier amplifier 12 and the output signal of the peak amplifier 13 are combined, the signal distributor 11 has to further delay the phase of the signal to be outputted to the peak amplifier 13 side by 180-degree.

When each of the Doherty combiner 14 and the impedance transformer 15 is formed by using the phase inversion type transmission line transformers with quarter wavelength, these can be integrally formed. And the integrated one is the transmission line transformer 20 having the dual-coaxial structure which is used in the descriptions of the above exemplary embodiments.

The configuration of FIG. 9 is applicable to not only the Doherty amplifier but the inverted Doherty amplifier.

In the above exemplary embodiments, examples are described in which the Doherty combiner 14 and the impedance transformer 15 are formed by using the quarter wavelength transmission line transformers which has a coaxial structure. However it is obvious for a person ordinarily skilled in the art that the transmission line transformer can be formed by using not only the coaxial structure but also a transmission line transformer configured by using a planar circuit like a printed circuit board. The transmission line transformer only has to be one having a pair of conductors. And, it is obvious for a person ordinarily skilled in the art that an equivalent phase inversion type transformer with quarter wavelength can be formed by optionally selecting a combination of connection and grounding of the center conductor and the outer conductor in one end (left end in FIG. 9) and the other end (right end in FIG. 9) of the transmission line transformer.

This application is based upon and claims the benefit of priority from Japanese patent application No. 2012-202590, filed on Sep. 14, 2012, the disclosure of which is incorporated herein in its entirety by reference.

The invention claimed is:

1. A transmitting amplifier comprising one of a carrier amplifier and a peak amplifier as a first amplifier and the other as a second amplifier, the transmitting amplifier comprising:

a quarter wavelength transmission line transformer with a dual-coaxial structure such that a center conductor, an inner conductor, and an outer conductor are formed in that order from the center toward the outside, wherein the center conductor and the inner conductor constitute a first coaxial line, the inner conductor and the outer conductor constitute a second coaxial line, the output of the first amplifier is connected to one end of the first and second coaxial lines, an output terminal is connected to the other end of the first and the second coaxial lines, and the other end of the first coaxial line, the output of the second amplifier, and the other end of the second coaxial line are connected, wherein the one end of the first coaxial line is connected to the output of the first amplifier, and the one end of the second coaxial line is connected to the output terminal, wherein at the one end of the first and the second coaxial lines, the center conductor is connected to the output of the first amplifier, the inner conductor is grounded, and the outer conductor is connected to the output terminal, and wherein at the other end of the first and the second coaxial lines, the center conductor is grounded, the inner conductor is connected to the outer conductor, and the outer conductor is connected to the output of the second amplifier.

2. A transmitting amplifier comprising one of a carrier amplifier and a peak amplifier as a first amplifier and the other as a second amplifier, the transmitting amplifier comprising:

a quarter wavelength transmission line transformer with a dual-coaxial structure such that a center conductor, an inner conductor, and an outer conductor are formed in that order from the center toward the outside, wherein the center conductor and the inner conductor constitute a first coaxial line, the inner conductor and the outer conductor constitute a second coaxial line, the output of the first amplifier is connected to one end of the first and second coaxial lines, an output terminal is connected to the other end of the first and the second coaxial lines, the other end of the first coaxial line, the output of the second amplifier, and the other end of the second coaxial line are connected, the one end of the first coaxial line is connected to the output of the first amplifier, and the one end of the second coaxial line is connected to the output terminal, wherein at the one end of the first and the second coaxial lines, the center conductor is connected to the output of the first amplifier, the inner conductor is grounded, and the outer conductor is connected to the output terminal, and wherein at the other end of the first and the second coaxial lines, the inner conductor is grounded, the center conductor is connected to the outer conductor, and the center conductor is connected to the output of the second amplifier.

3. A transmitting amplifier comprising one of a carrier amplifier and a peak amplifier as a first amplifier and the other as a second amplifier, the transmitting amplifier comprising:

a quarter wavelength transmission line transformer with a dual-coaxial structure such that a center conductor, an inner conductor, and an outer conductor are formed in that order from the center toward the outside, wherein the center conductor and the inner conductor constitute a first coaxial line, the inner conductor and the outer conductor constitute a second coaxial line, the output of the first amplifier is connected to one end of the first and second coaxial lines, an output terminal is connected to the other end of the first and the second coaxial lines, the other end of the first coaxial line, the output of the second amplifier, and the other end of the second coaxial line are connected, wherein the one end of the first coaxial line is connected to the output terminal, and the one end of the second coaxial line is connected to the output of the first amplifier, wherein at the one end of the first and the second coaxial lines, the center conductor is connected to the output terminal, the inner conductor is grounded, and the outer conductor is connected to the output of the first amplifier, and wherein at the other end of the first and the second coaxial lines, the center conductor is grounded, the inner conductor is connected to the outer conductor, and the outer conductor is connected to the output of the second amplifier.

4. A transmitting amplifier comprising one of a carrier amplifier and a peak amplifier as a first amplifier and the other as a second amplifier, the transmitting amplifier comprising:

a quarter wavelength transmission line transformer with a dual-coaxial structure such that a center conductor, an inner conductor, and an outer conductor are formed in that order from the center toward the outside, wherein the center conductor and the inner conductor constitute a first coaxial line, the inner conductor and the outer conductor constitute a second coaxial line, the output of the first amplifier is connected to one end of the first and second coaxial lines, an output terminal is connected to the other end of the first and the second coaxial lines, the other end of the first coaxial line, the output of the second amplifier, and the other end of the second coaxial line are connected, wherein the one end of the first coaxial line is connected to the output terminal, and the one end of the second coaxial line is connected to the output of the first amplifier, wherein at the one end of the first and the second coaxial lines, the center conductor is connected to the output terminal, the inner conductor is grounded, and the outer conductor is connected to the output of the first amplifier, and wherein at the other end of the first and the second coaxial lines, the inner conductor is grounded, the center conductor is connected to the outer conductor, and the center conductor is connected to the output of the second amplifier.

5. A transmitter that uses the transmitting amplifier of claim 1.

6. A transmitter that uses the transmitting amplifier of claim 2.

7. A transmitter that uses the transmitting amplifier of claim 3.

8. A transmitter that uses the transmitting amplifier of claim 4.

* * * * *